United States Patent [19]
Hirayama et al.

[11] Patent Number: 5,461,338
[45] Date of Patent: Oct. 24, 1995

[54] SEMICONDUCTOR INTEGRATED CIRCUIT INCORPORATED WITH SUBSTRATE BIAS CONTROL CIRCUIT

[75] Inventors: Takeshi Hirayama; Masao Fukuma, both of Tokyo, Japan

[73] Assignee: NEC Corporation, Tokyo, Japan

[21] Appl. No.: 48,662

[22] Filed: Apr. 16, 1993

[30]     Foreign Application Priority Data

Apr. 17, 1992  [JP]  Japan .................................. 4-098133

[51] Int. Cl.⁶ ...................................................... G05F 3/16
[52] U.S. Cl. ........................... 327/534; 327/538; 327/544
[58] Field of Search ................................. 307/291, 296.2, 307/296.3, 571; 327/534, 538, 544

[56]                References Cited

U.S. PATENT DOCUMENTS

| | | | |
|---|---|---|---|
| 4,460,835 | 7/1984 | Masuoka ................................. | 307/291 |
| 4,691,123 | 9/1987 | Hashimoto ............................. | 307/296.3 |
| 4,963,769 | 10/1990 | Hiltpold et al. ....................... | 307/296.3 |
| 5,045,717 | 9/1991 | Moen, Jr. et al. ..................... | 307/296.3 |
| 5,218,238 | 6/1993 | Nonaka et al. ........................ | 307/296.3 |
| 5,280,455 | 1/1994 | Kanaishi ................................. | 307/64 |

OTHER PUBLICATIONS

Yamamoto, Toyoji et al. "A New CMOS Structure For Low Temperature Operation With Forward Substrate Bias" 1992 Symposium On VLS Technology Digest Of Technical Papers, 1992 pp. 104 & 105.

*Primary Examiner*—Kristine L. Kincaid
*Assistant Examiner*—Shawn Riley

[57]     ABSTRACT

The semiconductor IC according to this invention comprises an internal circuit including a plurality of transistors formed on a P-type or an N-type substrate (or a well) which carries out a prescribed signal processing operation during the time of operation mode, a standby detection circuit which generates a standby detection signal of active level by detecting standby mode, a bias potential generating circuit which generates a forward bias potential from the substrate (well) of the transistor to the source electrode, and a switching circuit which supplies to the substrate (well) the potential of the source electrode and the bias potential in response to the active level and the inactive level, respectively, of the standby detection signal. At the time of the operation mode, a high speed operation is secured by bringing the transistors to a low threshold voltage by receiving the supply of the bias potential, while at the time of the standby mode, the generation of malfunctions and defective data holding are prevented and the power consumption is saved by raising the threshold voltage of the transistors through a halt of supply of the bias voltage to the substrate (well).

8 Claims, 4 Drawing Sheets

SEMICONDUCTOR INTEGRATED CIRCUIT INCORPORATED WITH SUBSTRATE BIAS CONTROL CIRCUIT

BACKGROUND OF THE INVENTION

1. Field of the Invention

The present invention relates to a semiconductor integrated circuit (abbreviated as semiconductor IC hereinafter) and, more particularly, to a semiconductor IC consisting of MOS transistors (MOS ICs) adapted to the requirements of multifunction and high speed operation.

2. Description of the Prior Art

MOS ICs, that are currently in most general use, receives a power supply voltage of 5 V and includes MOS transistors having a threshold voltage of about 0.7 V and a gate length of about 1 μm as a typical size, in order to communicate with transistor-transistor-logic (TTL) circuits, to uniform their fabrication processes, or the like. Of late, however, demands for multifunction and high speed of semiconductor ICs are strong, and developments to satisfy these demands are in progress.

In order to realize the multifunction and high speed operation, technologies for enhancing fine geometry of the circuit elements and for raising the level of integration based on the fine geometry are indispensable, and a great deal of effort is being expended on them. As a result, the refinement is proceeding in the gate length, for example, from the above-mentioned value of 1 μm to 0.6 μm, and further to 0.35 μm. Moreover, in order to realize a high speed operation, it is convenient to reduce an amplitude of a signal to be handled. For this purpose, the operating voltages for various parts are lowered (that is, reduction of voltages). The reduction of voltage is proceeding in the supply voltage for example, from the above-mentioned value of 5 V to 3.3 V, and further to 2.5 V.

Accompanying the reduction of voltages, there is required lowering of the threshold voltage of the transistor (referred to as threshold voltage reduction hereinafter) for discrimination of high level and low level of signals. The threshold voltage reduction is proceeding, for example, from the above-mentioned value of 0.7 V to about 0.2–0.4 V.

The improvement of technology for fine geometry enables the realization of fine geometry of circuit elements and wirings through which it contributes to the reduction of the propagation time of carriers, namely, to the increase of the operating speed of the transistors. On the other hand, the reduction in the electrode spacing urges to make the insulating film thin, which requires the reduction of voltage for securing the reliability. The reduction of voltage leads to reduction of power consumption which in turn enables high integration. In this way, the multifunction and the high operating speed of semiconductor ICs are realized by the unified interaction of technologies for fine geometry, voltage reduction, threshold voltage reduction, high integration, and the like.

The aforementioned threshold voltage reduction can be realized by the technique of selecting various parameters at the design and fabrication stages such as selection of sizes for various parts, control of impurity concentrations, or the like of the transistor, the technique of applying a forward bias voltage to the junction part between a semiconductor substrate (or a P-well or an N-well within the substrate, and similarly hereinafter) and the source region of a transistor formed on the surface of the substrate, and the combination of these techniques (see, for example, "A New CMOS Structure for Low Temperature Operation with Forward Substrate Bias", IEEE 1992 Symposium on VLSI Technology Digest of Technical Papers).

The signal processing operation of the semiconductor ICs employing transistors with threshold voltage reduction is hardly affected in the normal operation mode even when there are induced noise, temperature change, or the like in the ground wiring and power supply wiring, since signal processing operation such as data rewriting is executed in response to a system clock. However, in a standby mode in which the system clock is stopped being supplied to hold an internal condition, the potential difference between the channel formation part of the transistor and the substrate (well) is small, so that, the carriers within the channel reach the substrate (well) by going over the energy barrier for the channel through acquisition of slight energy from induced noise, temperature change, or the like, preventing the carriers from the source electrode to arrive at the drain electrode. Consequently, there occur malfunctions, such as variation, inversion, or the like, or faulty data holding of the binarized values to be held by the transistor, namely, the level of the data. Moreover, since the induced noise easily exceeds the threshold voltage of the transistor, level inversion of held data tends to occur.

As a technique for solving these problems in the standby mode, there is frequently adopted a method of raising the threshold voltage of the transistor by applying a reverse bias to the substrate (well) where the transistor is formed. However, according to the technique, there are required a reverse bias generating circuit, wirings for supplying the reverse bias, and the like, creating power consumption by the reverse bias generating circuit itself, and power consumption by the wirings and the substrate (well), and the like due to the very fact that they are parts of a semiconductor device. In particular, in semiconductor ICs of the type which back up the standby mode by batteries, the life of the batteries is reduced conspicuously.

BRIEF SUMMARY OF THE INVENTION

Object of the Invention

It is therefore an object of the invention to provide a semiconductor IC which is capable of securing high speed operation in the operation mode, and prevention of malfunctions and saving of power consumption in the standby mode.

Summary of the Invention

According to this invention, there is obtained a semiconductor IC comprising an internal circuit which includes a plurality of transistors formed on a P-type or N-type substrate or a well (i.e., a substrate area) and carries out a predetermined signal processing operation in a normal operation mode, detection means which detects a standby mode that is different from the normal operation mode and generates a standby detection signal of active level, means for generating a forward bias potential from the substrate area to the source region of the transistor, and switching means which supplies the potential of the source electrode and the bias potential to the substrate area in response to the active level and the inactive level, respectively, of the standby detection signal.

In this semiconductor IC, during the period of operation mode the high speed operation of the internal circuits is secured by supplying a forward bias potential to the substrate area to lower the threshold voltage of the transistor, and during the period of standby mode the generation of malfunctions and faulty data holding due to induced noise or temperature change is prevented by halting the supply of the bias potential to the substrate area to set the transistor to the threshold voltage determined by the selection of various parameters in the stage of design and fabrication. Further by halting the supply of the bias potential during the period of the standby mode it is possible to eliminate power consumption during that period, and reduce the power consumption of the IC as a whole.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
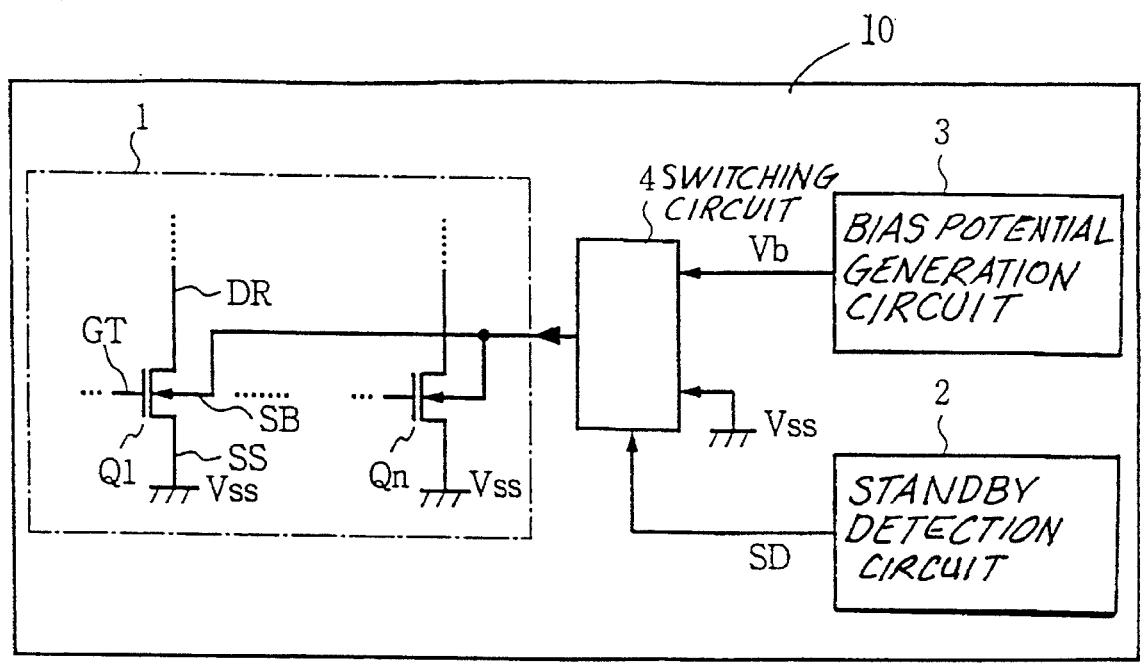
FIG. 1 is a block diagram including a partial circuit diagram for a first embodiment of the invention.
Figure 2:
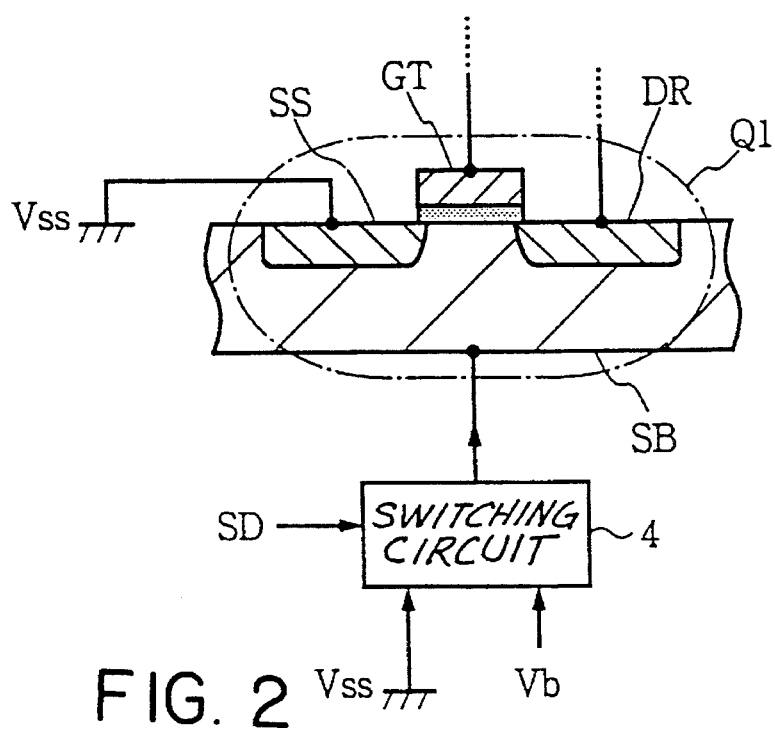
FIG. 2 is a sectional diagram including a partial block diagram of the embodiment.

Referring to both FIG. 1 and FIG. 2, the semiconductor IC 10 according to the first embodiment of this invention comprises an internal circuit 1 including a plurality of N-channel transistors Q1–Qn formed on a P-type semiconductor substrate (or a well) SB which carries out a predetermined signal processing operation during the period of operation mode, a standby detection circuit 2 which detects the standby mode and generates an active level standby detection signal SD during this mode, a bias potential generating circuit 3 which generates a bias potential Vb of predetermined magnitude where the bias from the semiconductor substrate (well) SB (referred to as substrate (well) SB hereinafter) of the transistors Q1–Qn to source region SS becomes forward (referred to as forward bias hereinafter) with respect to the junction part between the substrate (well) of these transistors and the source electrode, and a switching circuit which supplies the substrate (well) of the transistors Q1–Qn with a potential equal to potential Vss (referred to as source potential Vss hereinafter), where it is the ground potential 0 V in this embodiment) of the source electrode SS of the transistors Q1–Qn in response to the active level of the standby detection signal SD and with the bias potential Vb in response to the inactive level.

In this embodiment, during the period of the standby mode, potential Vsb (referred to as substrate potential Vsb hereinafter) of the substrate (well) SB is equal to Vss since the switching circuit 4 supplies the source potential Vss. The threshold voltage (Vtl) of the transistors Q1–Qn during this period is set at a high value (0.7 V, for example) due to selection of various parameters in the design and fabrication stages. Accordingly, generation of malfunctions, faulty data holding, or the like of the internal circuit 1 due to induced noise or temperature change can be avoided.

Figure 3:
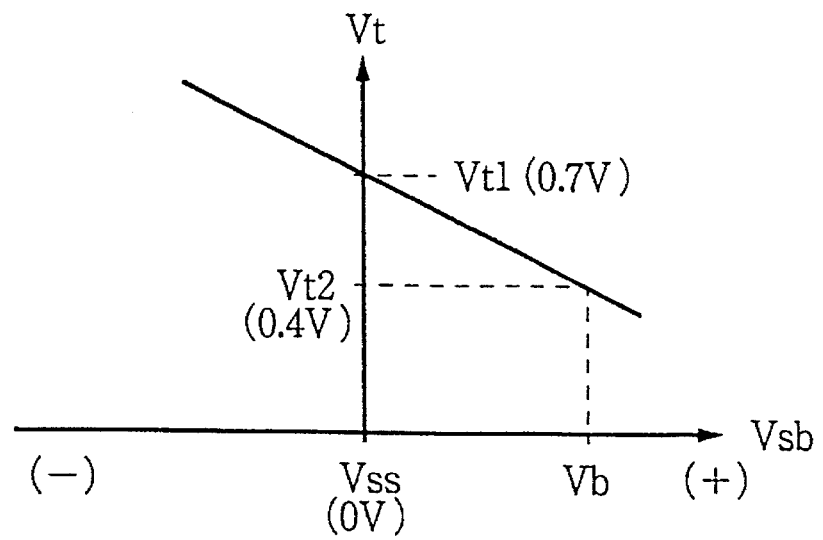
FIG. 3 is a characteristic curve showing the change of the threshold voltage versus the substrate potential of the transistor.

In the normal operation mode due to cancellation of the standby mode, the substrate potential Vsb becomes Vb since the switching circuit 4 supplies the bias voltage Vb. Referring to FIG. 3 showing the change in the threshold voltage Vt when the substrate potential Vsb is varied with the source potential Vss fixed (0 V), it can be found that the bias potential Vb is a forward bias which is on the positive side of the source potential Vss. Therefore, the threshold voltage Vt2 of the transistors Q1–Qn at this time is set at a value (0.4 V, for example) lower than the value in the standby mode. Accordingly, the operating voltage including the power supply voltage can be set low, and high speed operation of the circuit becomes possible. Moreover, even if the threshold voltage of the transistor is low, in the internal circuit 1 various kinds of signal processing operation such as data rewriting are carried out in response to the system clock, so that the signal processing operation will not be affected by induced noise, temperature change, or the like.

In the prior art semiconductor ICs, during the operation mode, high speed operation becomes possible by 10 means of transistors of low threshold voltage determined by the selection of the various parameters in the design and fabrication stages, and the generation of malfunctions and faulty data holding due to induced noise or temperature change can be prevented by signal processing operation that corresponds to the system clocks.

However, in the standby mode, a backward bias is applied to the semiconductor substrate (well) to raise the threshold voltage of each transistor in order to prevent the generation of the malfunctions or defective data holding. Therefore, there arise power consumption due to the backward bias generation circuit, the wirings for supplying the backward bias, the substrate (well), and the like, causing a marked consumption of the backup batteries.

In contrast, according to this invention, application of the bias potential Vb to the substrate (well) SB is halted during the period of the standby mode as mentioned above. Therefore, the power consumption by the wirings for supplying the bias potential and by the substrate (well) is absent during that period, and the power consumption is saved accordingly.

It should also be noted in this embodiment that the power consumption due to application of the bias potential Vb to the substrate (well) is extremely small compared with the power consumption during the operation of the internal circuit 1, and since the internal circuit is normally 10 driven during the operation mode by an external power supply of large capacity, the increase in the power consumption due to application of the bias potential Vb is negligibly small.

Figure 4:
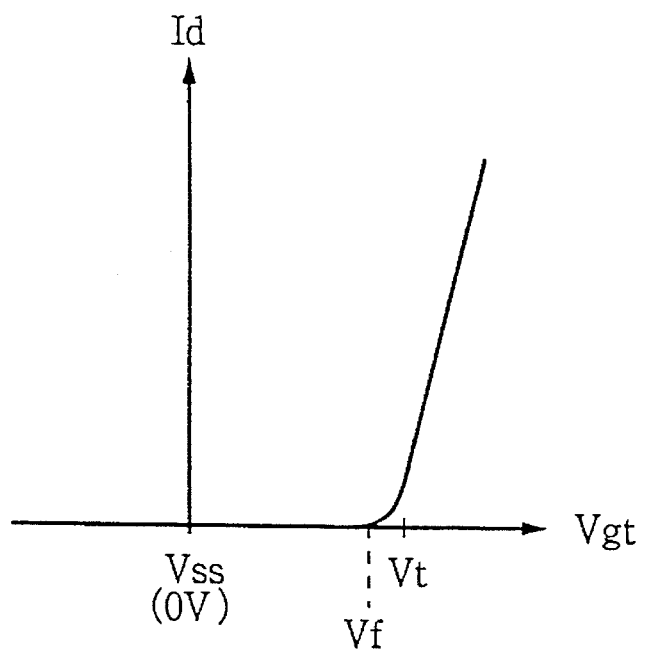
FIG. 4 is a characteristic curve showing the change of the drain current versus the gate potential of the transistor.

Furthermore, referring to FIG. 4 showing the drain current Id versus potential Vgt (referred to as gate potential Vgt hereinafter) of gate electrode GT of the transistor, as the gate potential Vgt reaches the threshold voltage Vt a channel is formed in the substrate (well) SB and the drain current is increased rapidly. Since the on/off operation of the transistor becomes impossible if the bias potential Vb to the substrate (well) becomes the corresponding potential for the channel formation, the bias potential Vb is set to be smaller than the flat band potential Vf (the voltage between the substrate and the gate electrode when there are no excess change and a depletion layer in the substrate (well) SB) immediately before the channel formation.

Figure 5:
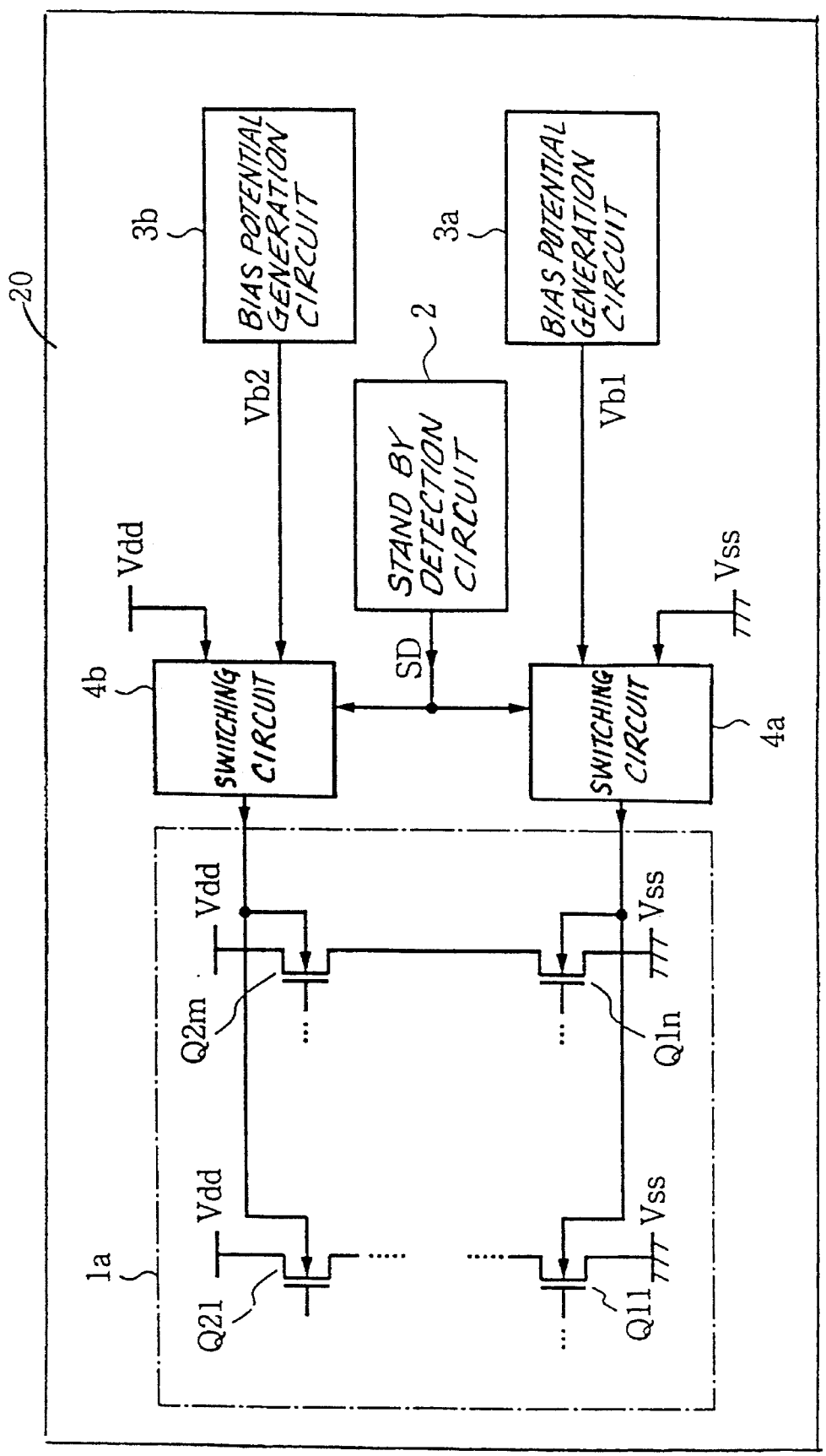
FIG. 5 is a block diagram including a partial circuit diagram for a second embodiment of the invention.

Referring to FIG. 5, the semiconductor IC 20 of the second embodiment according to the invention comprises an internal circuit 1a which includes a plurality of N-channel transistors Q1l–Q1n formed on a P-type substrate (or a well) (referred to as P-type substrate hereinafter) and a plurality of P-channel transistors Q2l–Q2m formed on an N-type substrate (or a well) (referred to as N-type substrate hereinafter) that carries out a predetermined signal processing operation during the period of the operation mode, a standby detection circuit 2 which generates a standby detection signal SD by detecting that the system is in the standby mode, bias potential generation circuits 3a and 3b which generate forward bias potentials Vb1 and Vb2 corresponding to the P-type substrate and the N-type substrate, respectively, and switching circuits 4a and 4b which supply the P-type substrate and the N-type substrate source potentials (Vss and Vdd) of the corresponding transistors (Q1l–Q1n and Q2l–Q2m) in response to the active level of the standby detection signal, and the corresponding bias potentials (Vb1 and Vb2) in response to its inactive level.

This embodiment represents an application of this invention to a semiconductor IC which includes the N-channel transistors Q1l–Q1n and the P-channel transistors Q2l–Q2m in the internal circuit. Except for the separate supply of the bias potentials Vb1 and Vb2 to the substrate (well) of these N-channel transistors Q1l–Q1n and the substrate (well) of the P-channel transistors Q2l–Q2m, respectively, the fundamental operation and the effect of this embodiment are the same as those of the first embodiment. Since the threshold voltage of the N-channel transistors Q1l–Q1n and the threshold voltage of the P-channel transistors Q2l–Q2m can be controlled separately in this embodiment, the tolerance range of fluctuation in the fabrication can be enlarged, and the effective yield can be improved accordingly.

Figure 6:
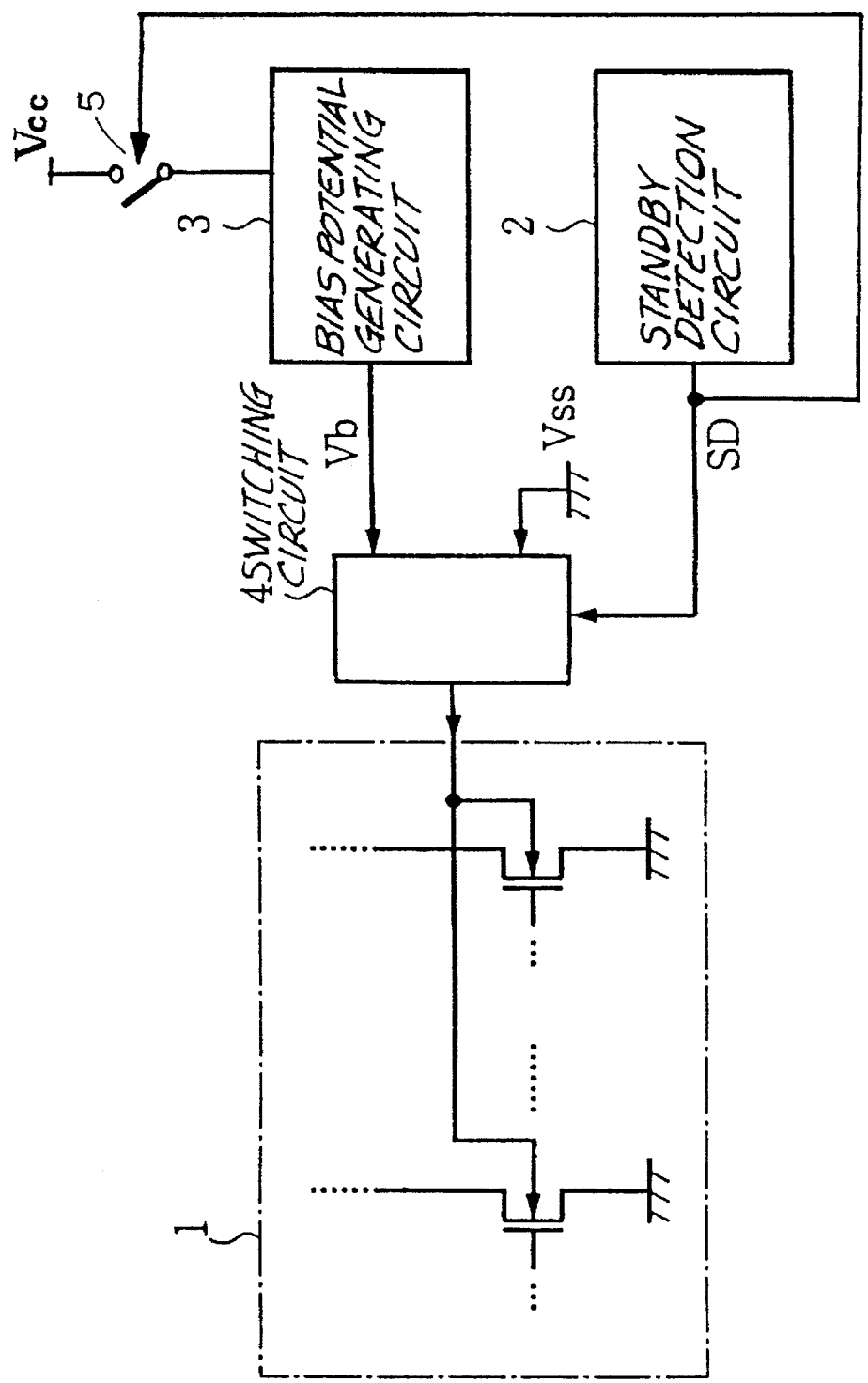
FIG. 6 is a block diagram illustrative of a third embodiment of the present invention.

Although the bias potential generation circuits (3, 3a, and 3b) and the switching circuits (4, 4a, and 4b) are taken to be separate circuits in the above-mentioned embodiments, these may be combined into circuits of one kind. Moreover, if the power supply to the bias potential generation circuits (3, 3a and 3b) is halted in the standby mode, the power consumption during the standby mode can further be saved. That is, as shown in FIG. 6 as a third embodiment, there is provided a switch 5 between the bias potential generating circuit 3 and a power voltage line Vcc. This switch 5 is turned OFF when the signal SD takes an active level to indicate the standby mode.

Although the invention has been described with reference to specific embodiments, this description is not meant to be construed in an limiting sense. Various modifications of the disclosed embodiments, as well as other embodiments of the invention, will become apparent to persons skilled in the art upon reference to the description of the invention. It is therefore contemplated that appended claims will cover any modifications or embodiments as fall within the true scope of the invention.

What is claimed is:

1. A semiconductor integrated circuit comprising:
    an internal circuit including a plurality of transistors formed on a semiconductor substrate area of one conductivity type, said internal circuit carrying out a predetermined signal processing operation in a normal operation mode;
    standby detection means for generating a standby detection signal of an active level in a standby mode which is different from said normal operation mode;
    means for generating such a bias potential that forwardly biases a junction between said semiconductor substrate area and a source region of each of said plurality of transistors; and
    switching means for supplying said semiconductor substrate area with said bias potential in response to an inactive level of said standby detection signal and with a standby potential different from said bias potential in response to said active level of the standby detection signal.

2. A semiconductor integrated circuit as claimed in claim 1, wherein said bias potential is smaller than a flat band voltage between said semiconductor substrate area and said source regions.

3. A semiconductor integrated circuit as claimed in claim 1, wherein said plurality of transistors consist of N-channel transistors and P-channel transistors, and said bias potential generating means generates as said bias potential a first bias potential to be supplied to P-type semiconductor substrate area for said N-channel transistor and a second bias potential to be supplied to N-type semiconductor substrate area for said P-channel transistor.

4. A semiconductor integrated circuit as claimed in claim 1, further comprising means for stopping supply of power voltage to said bias potential generating means in response to the active level of said standby mode detection signal.

5. A semiconductor integrated circuit comprising an internal circuit having a normal operation mode and a standby mode, said internal circuit including a plurality of insulated gate field effect transistors each having source and drain regions formed in a substrate area, said source region being supplied with a power voltage, and a substrate bias control circuit coupled to said substrate area and supplying said substrate area with said power voltage in said standby mode and with a bias voltage in said normal operation mode, said bias voltage being different from said power voltage.

6. The integrated circuit as claimed in claim 5, wherein said substrate bias control circuit includes a voltage generator generating said bias voltage at an output node thereof, a voltage line supplied with said power voltage, and a switching circuit forming an electrical path between said substrate area and said output node of said voltage generator in said normal operation mode and between said substrate area and said voltage line in said standby mode.

7. The integrated circuit as claimed in claim 5, wherein said source region is of an N-type and said substrate area is of a P-type and is biased more positively than said source region by said bias voltage in said normal operation mode.

8. The integrated circuit as claimed in claim 5, wherein said source region is of a P-type and said substrate area is of an N-type and biased more negatively than said source region by said bias voltage in said normal operation mode.

* * * * *